(12) United States Patent
Yamamoto et al.

(10) Patent No.: US 7,956,409 B2
(45) Date of Patent: Jun. 7, 2011

(54) SEMICONDUCTOR DEVICE HAVING TRENCH GATE STRUCTURE

(75) Inventors: Hideo Yamamoto, Kanagawa (JP);
Kenya Kobayashi, Kanagawa (JP);
Atsushi Kaneko, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 281 days.

(21) Appl. No.: 12/232,074

(22) Filed: Sep. 10, 2008

(65) Prior Publication Data
US 2009/0072300 A1 Mar. 19, 2009

(30) Foreign Application Priority Data

Sep. 19, 2007 (JP) ................... 2007-242011

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/328; 257/E27.06

(58) Field of Classification Search ................... 257/328, 257/E27.06
See application file for complete search history.

(56) References Cited

U.S. PATENT DOCUMENTS

| 5,998,837 A | 12/1999 | Williams |
| 6,351,009 B1 | 2/2002 | Kocon et al. |
| 2002/0019099 A1 * | 2/2002 | Williams et al. ............. 438/270 |

* cited by examiner

*Primary Examiner* — David S Blum
(74) *Attorney, Agent, or Firm* — McGinn IP Law Group PLLC

(57) ABSTRACT

The present invention provides a vertical MOSFET which has striped trench gate structure which can secure avalanche resistance without increasing Ron. A vertical MOSFET 100 comprises a plurality of gate trenches 7 which is arranged in stripes, an array which is sandwiched with the plurality of gate trenches 7 and includes $N^+$ source regions 4N+ and $P^+$ base contact regions 5P+, and a diode region (anode region 6P+) which is formed so as to contact with two gate trenches 7. The $N^+$ source regions 4N+ and the base contact regions 5P+ are alternately arranged along a longitudinal direction of the gate trench 7. Size of the diode region (anode region 6P+) corresponds to at least one of the $N^+$ source regions 4N+ and two of the $P^+$ base contact regions 5P+.

10 Claims, 15 Drawing Sheets

SEMICONDUCTOR DEVICE HAVING TRENCH GATE STRUCTURE

CROSS-REFERENCE TO RELATED APPLICATIONS

This application is based upon, claims the benefit of priority of, and incorporates by reference the contents of Japanese Patent Application No. 2007-242011 filed on Sep. 19, 2007.

BACKGROUND

1. Field of the Invention

The present invention relates to a semiconductor device, and in particular, to a semiconductor device which has trench gate structure.

2. Description of the Related Art

In a vertical metal-oxide semiconductor field-effect transistor (MOSFET) with striped trench gate structure, avalanche resistance is influenced by a width, a space, and a gross area of a $P^+$ base contact region. The narrower the space of the $P^+$ base contact region is, the more avalanche resistance improves. On the other hand, since a channel region decreases, the on-resistance (Ron) which is one of the performance indices of a vertical MOSFET increases. Hence, it is required to achieve structure of enhancing the avalanche resistance with securing the width of the $P^+$ base contact region (securing the channel region) to reduce the Ron.

An example of a vertical MOSFET which has conventional striped trench gate structure is disclosed in U.S. Pat. No. 6,351,009 B1 (Kocon et al.). With reference to FIGS. 9 to 11, the structure of conventional N channel type vertical MOSFET 300 disclosed in Kocon et al. will be described. FIG. 9 is a schematic plan view showing planar structure of the vertical MOSFET 300 disclosed in Kocon et al. FIG. 10 is a sectional view taken along line 9A-9A' of FIG. 9, and FIG. 11 is a sectional view taken along line 9B-9B' of FIG. 9.

As shown in FIGS. 9 to 11, a doped upper layer 302 is arranged on a doped $N^+$ substrate 301. The upper layer 302 includes an N drain region 303 and P wells 305. As shown in FIG. 10, $P^+$ body regions 304 are formed in the upper layer 302. The $P^+$ body regions 304 are mutually isolated by a gate trench 307. On the other hand, as shown in FIG. 11, $N^+$ source regions 306 are formed by ion implantation and diffusion in the upper layer 302. The $N^+$ source regions 306 are isolated by the gate trench 307.

In the gate trench 307, an electroconductive gate material 310 and a dielectric layer 312 are formed. The gate trench 307 is plugged with the electroconductive gate material 310 and dielectric layer 312, and a surface 313 of the dielectric layer 312 and a surface 314 of the $P^+$ body region 304 become substantially coplanar. Then, a metal layer 315 is vapor-deposited on the surface 314. The metal layer 315 forms a contact between the $P^+$ body region 304 and $N^+$ source region 306.

As shown in FIG. 9, the vertical MOSFET 300 includes a plurality of arrays 317 of alternating $P^+$ body regions 304 and $N^+$ source regions 306. Each array 317 is arranged in contact with the gate trench 307, and is isolated from a next array 317. In the each array 317 arranged between gate trenches 307 in FIG. 9, a longitudinal dimension of the $N^+$ source region 306 is formed more widely than that of the $P^+$ body region 304. By this structure, a channel is formed in a plane at which the P well 305 located under the $N^+$ source region 306 is in contact with the gate trench 307, and the Ron which is one of the performance indices is determined. Furthermore, it is possible to narrow a gap between the gate trenches 307 by forming the gate trench 307 so that surface 313 and the surface 314 become substantially coplanar owing to the electroconductive gate material 310 and dielectric layer 312 like this structure. For this reason, it becomes possible to form in high density the channel regions in the same chip area, and to improve the Ron.

In addition, in U.S. Pat. No. 5,998,837 (Williams), an example of a vertical MOSFET which has a conventional striped trench gate structure is disclosed. FIGS. 12 to 15 show the structure of the conventional vertical MOSFET disclosed in Williams. FIGS. 12 and 13 are schematic plan views showing planar structure of vertical MOSFETs 310 and 311 disclosed in Williams. FIG. 14 is a sectional view taken along line 12A-12A' shown in FIG. 12, or a sectional view taken along line 13A-13A' shown in FIG. 13. FIG. 15 is a sectional view taken along line 12B-12B' shown in FIG. 12, or a sectional view taken along line 13B-13B' shown in FIG. 13. As shown in FIGS. 12 and 13, the vertical MOSFETs 310 and 311 disclosed in Williams have MOSFET cells 81 to 84 and a diode cell 85. Each of the MOSFET cells 81 to 84 has a single $N^+$ source region 88 and a single $P^+$ contact region 87. The diode cell 85 has a deep $P^+$ diffusion dP+ formed in parallel to a gate trench 91.

Nevertheless, the inventors have found out that there are the following issues in these prior arts.

In the conventional structure disclosed in Kocon et al., an optimum value of avalanche resistance exists according to a width and a space of the $P^+$ body region 304. In order to optimize the avalanche resistance, it is necessary to widen the width of the $P^+$ body region 304 and to narrow the space. For this reason, the $N^+$ source regions 306 become narrow, the channel regions decrease, and the Ron increases. Thus, when the Ron is emphasized, avalanche resistance is reduced, and when avalanche resistance is secured, the Ron gets worse, which are in a trade-off relation.

In addition, in the structure disclosed in Williams, the following problems arise. In the structure disclosed in Williams, each width (a space between two adjacent gate trenches 91) y of the MOSFET cells 81 to 84 is restricted by a width of the $N^+$ source region 88, a width of the $P^+$ contact region 87 and a width of the $N^+$ source region 88. For this reason, since it is not possible to narrow the space between the gate trenches 91, there arises a problem that integration is difficult.

SUMMARY

Hereafter, embodiments (features) of the present invention will be described using reference numerals and reference symbols used in DETAILED DESCRIPTION OF THE PREFERRED EMBODIMENTS. These reference numerals and reference symbols are added with parentheses in order to clarify correspondence between descriptions of CLAIM and DETAILED DESCRIPTION OF THE PREFERRED EMBODIMENTS. Nevertheless, these reference numerals and reference symbols should not be used for interpretation of a technical scope of the invention described in CLAIM.

A semiconductor device according to one aspect of the present invention comprises a plurality of gate trenches which are arranged in stripes, an array which are sandwiched with the plurality of gate trenches and includes source regions (4N+) and base contact regions (5P+), and a diode region (anode region 6P+) which is formed so as to contact with the two gate trenches (7). The source regions (4N+) and the base contact regions (5P+) are alternately arranged along a longitudinal direction of the gate trench (7). Size of the diode region (anode region 6P+) corresponds to at least one of the source regions (4N+) and two of the base contact regions (5P+).

Thereby, since reduction in a channel length is very slight, increase of the Ron is effectively suppressed. In addition, since it is possible to centralize an avalanche current on a diode region (anode region 6P+), it is possible to prevent breakdown of a device and it becomes possible to secure the avalanche resistance.

According to the present invention, it is possible to provide a vertical MOSFET which has striped trench gate structure which can secure avalanche resistance without increasing Ron.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
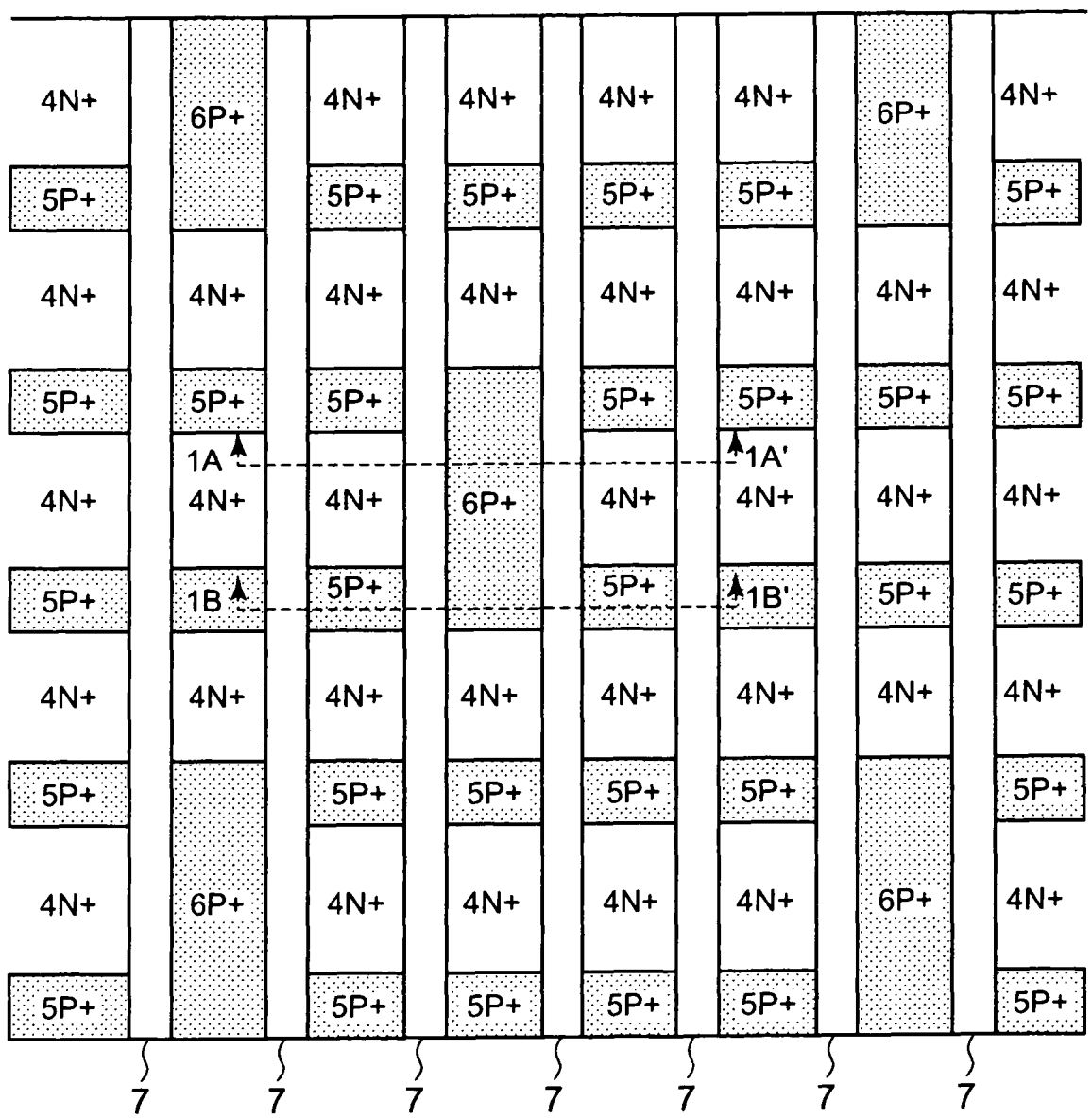
FIG. 1 is a schematic plan view showing planar structure of a vertical MOSFET 100 according to a first embodiment of the present invention.
Figure 2:
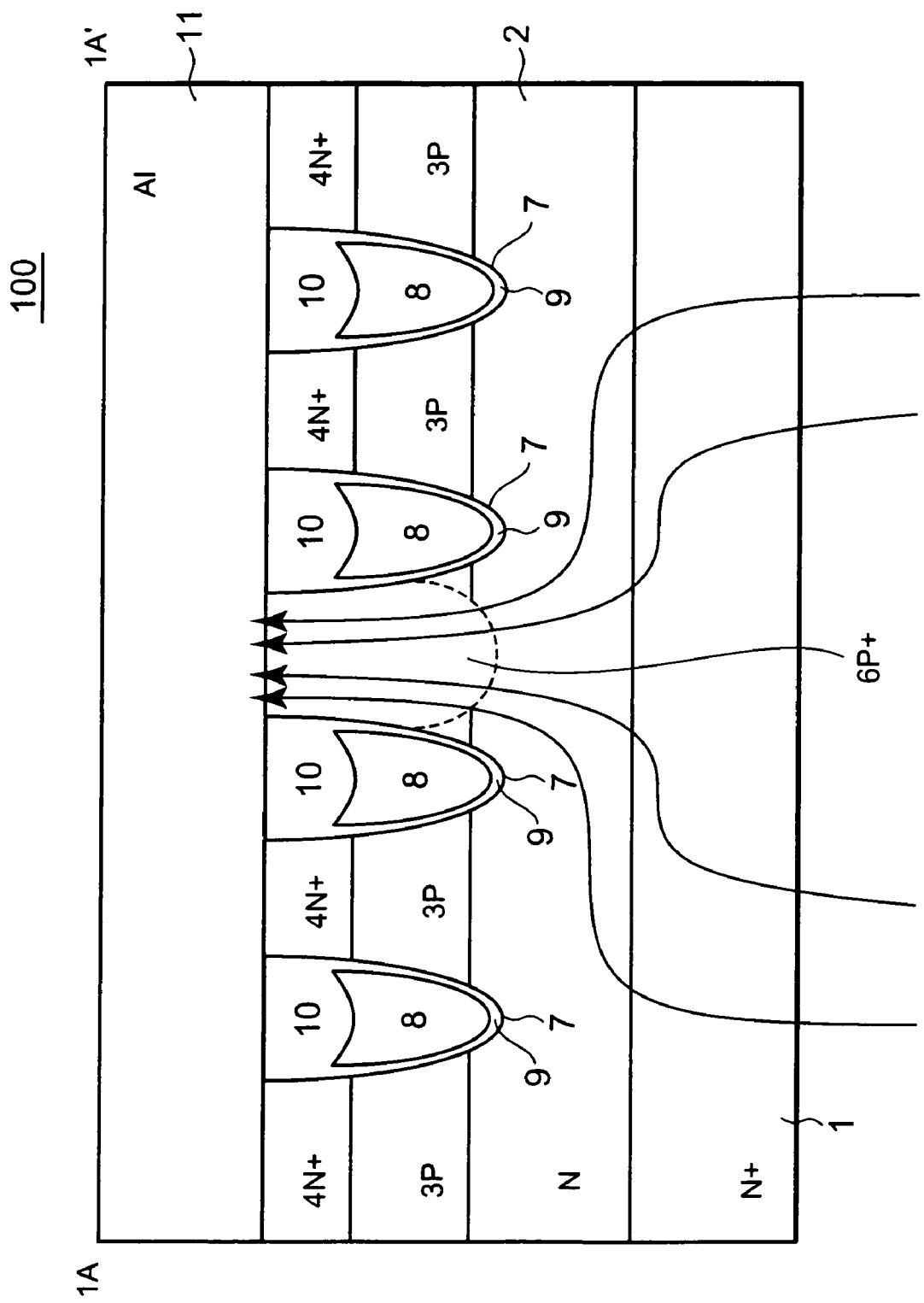
FIG. 2 is a schematic sectional view taken along line 1A-1A' of FIG. 1.
Figure 3:
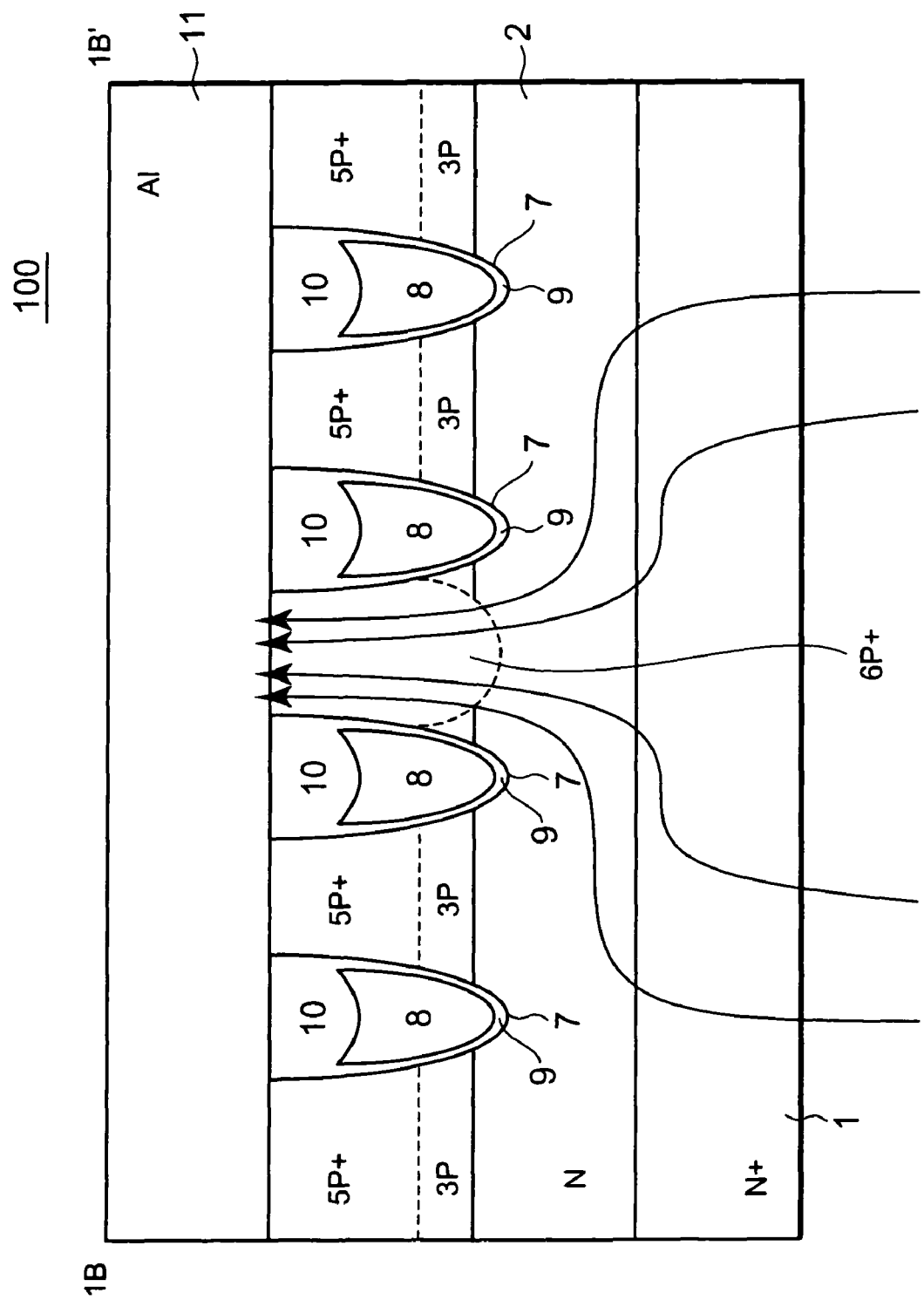
FIG. 3 is a schematic sectional view taken along line 1B-1B' of FIG. 1.

Construction of a semiconductor device according to a first embodiment of the present invention will be described with reference to FIG. 1 to FIG. 3. FIG. 1 is a schematic plan view showing planar structure of an N channel type vertical MOSFET 100 which is an example of the semiconductor device according to the first embodiment. FIG. 2 is a schematic sectional view taken along line 1A-1A' of FIG. 1. FIG. 3 is a schematic sectional view taken along line 1B-1B' of FIG. 1.

As shown in FIG. 1, the vertical MOSFET 100 has gate trenches 7 arranged in stripes. A plurality of gate trenches 7 are formed in a MOSFET cell region. In addition, these gate trenches 7 may be connected mutually in a peripheral region and become a single trench. In addition, the plurality of gate trenches 7 may not be connected mutually even in a peripheral region and remain being plural.

Between the gate trenches 7, $N^+$ source regions 4N+ and $P^+$ base contact regions 5P+ are formed. The $N^+$ source regions 4N+ and $P^+$ base contact regions 5P+ are alternately arranged along a longitudinal direction of the gate trenches 7. That is, in FIG. 1, the vertical MOSFET 100 includes a plurality of arrays of alternating the $N^+$ source regions 4N+ and $P^+$ base contact regions 5P+. The arrays and the gate trenches 7 are formed in a lateral direction in stripes by turns. These arrays are arranged in contact with the gate trenches 7. That is, each array is isolated from a next array by the gate trench 7.

In the each array, a part of an arbitrary $N^+$ source region 4N+ and an arbitrary $P^+$ base contact region 5p+ is formed as a diode region (anode region 6P+). For example, in FIG. 1, two diode regions (anode regions 6P+) are formed between first and second gate trenches 7 from the left (in a second array from the left).

In the vertical MOSFET 100, the diode region (anode region 6P+) has size corresponding to one $N^+$ source region 4N+ and two $P^+$ base contact regions 5P+. For example, as shown in FIG. 1, in a second array from the left, the diode region (anode region 6P+) is formed by being corresponding to a region having arbitrary two adjacent $P^+$ base contact regions 5P+ and one $N^+$ source region 4N+ sandwiched between the two adjacent $P^+$ base contact regions 5P+.

As shown in FIG. 2, an N drain region 2 is formed on an $N^+$ silicon substrate 1. A P base region 3P is formed in an upper part of the N drain region 2. In addition, the $N^+$ source region 4N+ is formed in an upper part of the P base region 3P. Gate trenches 7 are formed so as to divide the adjacent arrays each of which includes the P base region 3P and the N drain region 2. In the gate trench 7, a gate insulating film 9, a gate electrode 8 and an interlayer insulating film 10 are formed. The gate trench 7 is plugged with the gate insulating film 9, the gate electrode 8 and the interlayer insulating film 10. The gate insulating film 9 is a silicon oxide film typically. Although the interlayer insulating film 10 is not restricted in particular, NSG (non-doped silicate glass) can be used for it, for example. In addition, the anode region 6P+ is formed in a predetermined part in the P base region 3P. A surface of the interlayer insulating film 10 is almost coplanar with a silicon surface of the $N^+$ source region 4N+ and the anode region 6P+.

In addition, a source electrode 11 is formed on the $N^+$ source region 4N+, the anode region 6P+ and the interlayer insulating film 10. The $N^+$ source region 4N+ and the anode region 6P+ are contacted and electrically connected with the source electrode 11. The source electrode 11 is constructed of Al, for example. The $N^+$ silicon substrate 1 and N drain region 2 function not only as a drain region of the vertical MOSFET cooperatively, but also as a cathode region of the diode cooperatively.

As shown in FIG. 3, also in the 1B-1B' section, the N drain region 2 is formed on the $N^+$ silicon substrate 1 like the 1A-1A' section. The P base region 3P is formed in the upper part of the N drain region 2. In addition, the $P^+$ base contact region 5P+ is formed in an upper part of the P base region 3P. Gate trenches 7 are formed so as to divide the adjacent arrays each of which further includes the $P^+$ base contact region 5P+ formed on the P base region 3P. The structure of the gate trench 7 is the same as FIG. 2. In addition, the anode region 6P+ is formed in a predetermined part in the P base region 3P. Furthermore, the surface of the interlayer insulating film 10 is also almost coplanar with a silicon surface of the $P^+$ base contact region 5P+.

In addition, the source electrode 11 is also formed on the $P^+$ base contact region 5P+. The $P^+$ base contact region 5P+ is also contacted and electrically connected with the source electrode 11.

As shown in FIG. 1, a channel is formed in a plane at which the P base region 3P located under the $N^+$ source region 4N+ is in contact with the gate trench 307, and the Ron which is one of the performance indices is determined. As mentioned above, it is possible to lessen a gate trench interval by burying the gate trench 7 and isolating it from the source electrode 11. Thereby, it becomes possible to achieve high densification and to reduce the Ron.

The vertical MOSFET 100 does not secure the avalanche resistance by widening a width of the $P^+$ base contact region 5P+ to narrow the interval, but has a diode region (anode region 6P+) between gate trenches 7. Thereby, as shown by arrows in FIGS. 2 and 3, it is possible to centralize an avalanche current in the diode region (anode region 6P+) and to secure the avalanche resistance. In addition, since reduction in a channel length can be very slight, increase of the Ron can be effectively suppressed.

In the conventional vertical MOSFET 300, unless a width, an interval, a number (area), and arrangement of a $P^+$ body region 304 (equivalent to a $P^+$ base contact region 5P+ of the vertical MOSFET 100) are optimal, an avalanche current flows into an arbitrary MOSFET cell, electric potential of a P well 305 (equivalent to the P base region 3P of the vertical MOSFET 100) rises, and a parasitic bipolar transistor formed with the $N^+$ source region 306, the P well 305, and the N drain region 303 is turned on. As a result, there is a case that a large current flows in the parasitic bipolar transistor, and the device is destroyed.

Nevertheless, according to the vertical MOSFET 100 according to the first embodiment of the present invention, as shown in FIG. 2 and FIG. 3, by making a diode region (anode region 6P+) into size corresponding to at least one of the $N^+$ source regions 4N+ and two of $P^+$ base contact regions 5P+ in a MOSFET cell, it becomes possible to form the $P^+$ type region (anode region 6P+) deeper than the $P^+$ base contact region 5P+ easily. Thereby, it is possible to centralize the avalanche current in the diode region (anode region 6P+). In addition, since the diode regions (anode region 6P+) are dispersedly formed in arbitrary locations in MOSFET cells, even if an avalanche current begins to flow in any part of the vertical MOSFET 100, it is possible to flow promptly the avalanche current through a nearest diode region (anode region 6P+). Thereby, a parasitic bipolar transistor will not be turned on and it becomes possible to prevent breakdown of a device.

In addition, as shown in FIG. 1, in the vertical MOSFET 100, a diode region (anode region 6P+) is formed by being corresponding to a region having arbitrary two adjacent $P^+$ base contact regions 5P+ and one source region 4N+ sandwiched between the two adjacent $P^+$ base contact regions 5P+. Hence, it is possible to form a diode region (anode region 6P+) by using a mask for forming the source region 4N+ with which a mask pattern is formed so that the corresponding one of the source region 4N+ sandwiched between the two adjacent $P^+$ base contact regions 5P+ is not to be formed. And by using a mask for forming the $P^+$ base contact regions 5P+ with which a mask pattern for covering the same source region 4N+ is omitted so that the anode region 6P+ is to be formed. For this reason, what is necessary is just to reverse the mask pattern of the region between the two adjacent $P^+$ base contact regions 5P+ corresponding to the diode region (anode region 6P+) among conventional mask patterns, and hence, it is possible to form mask patterns easily. Thus, it is possible to easily perform designing or changing freely the number (area) and arrangement of diode regions (anode region 6P+) according to desired performance.

Second Embodiment

Figure 4:
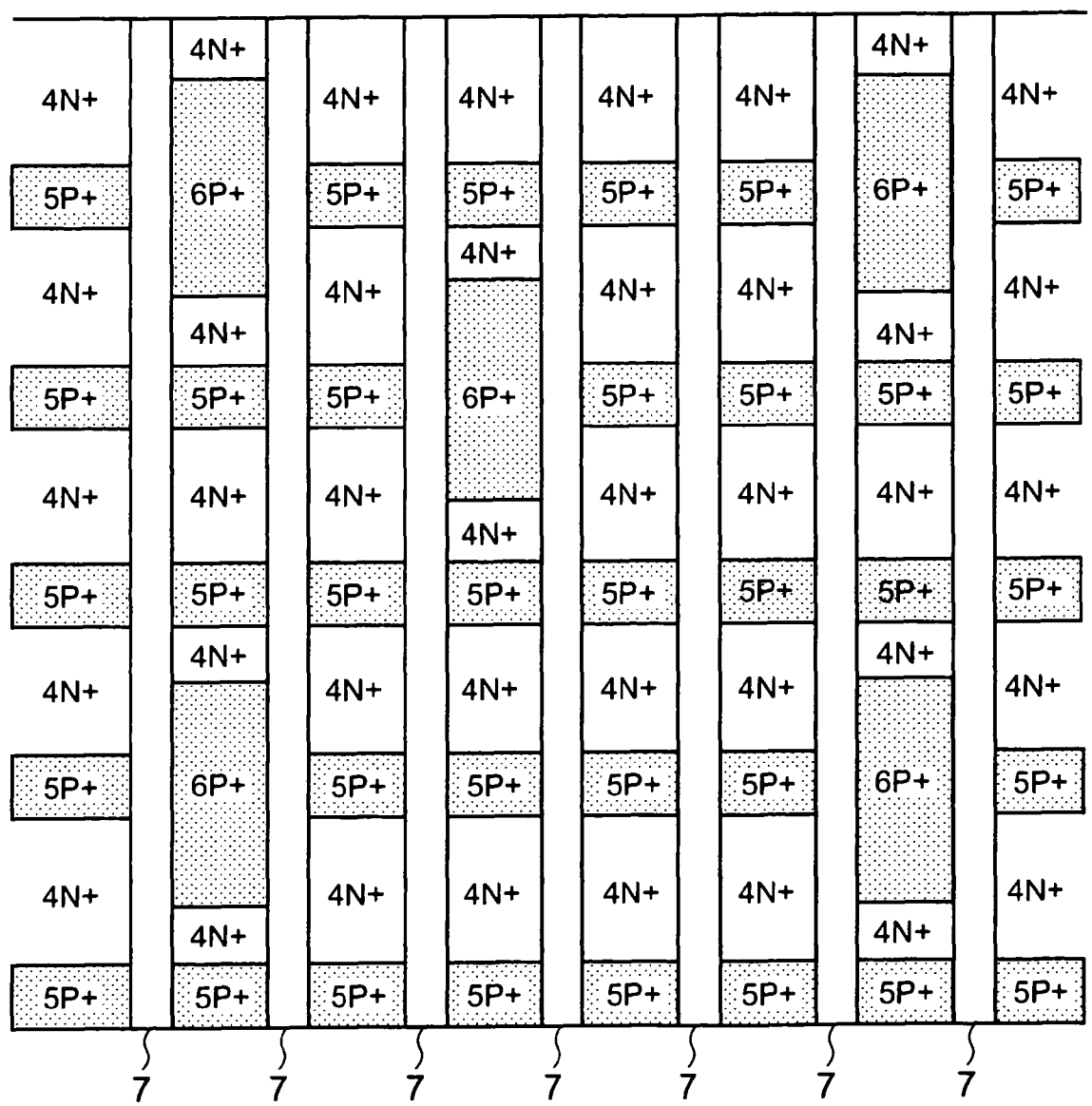
FIG. 4 is a schematic plan view showing planar structure of a vertical MOSFET 110 according to a second embodiment of the present invention.

Construction of a semiconductor device according to a second embodiment of the present invention will be described with reference to FIG. 4. FIG. 4 is a schematic plan view showing planar structure of an N channel type vertical MOSFET 110 which is an example of the semiconductor device according to the second embodiment. In the vertical MOSFET 110, a different point from the vertical MOSFET 100 shown in FIG. 1 is a formation position of a diode region (anode region 6P+). In addition, in FIG. 4, the same reference numerals are assigned to the same components as those in FIGS. 1 to 3, and their descriptions are omitted.

In the vertical MOSFET 100, a diode region (anode region 6P+) is formed in a part of arbitrary two $P^+$ base contact regions 5P+ and one $N^+$ source region 4N+ sandwiched between the two adjacent $P^+$ base contact regions 5P+. In the vertical MOSFET 110, the diode region (anode region 6P+) is formed so as to stride one $P^+$ base contact region 5P+.

Specifically, as shown in FIG. 4, the vertical MOSFET 110 has the gate trenches 7 arranged in stripes like the vertical MOSFET 100. Between the gate trenches 7, $N^+$ source regions 4N+ and $P^+$ base contact regions 5P+ are formed. The $N^+$ source regions 4N+ and $P^+$ base contact regions 5P+ are arranged alternately in a direction along the longitudinal direction of the gate trenches 7.

Then, two diode regions (anode region 6P+) are formed between first and second gate trenches 7 from the left in FIG. 4. In the vertical MOSFET 110, the diode region (anode region 6P+) has size corresponding to one $N^+$ source region 4N+ and two $P^+$ base contact regions 5P+. In addition, as shown in FIG. 4, in the second array from the left, a diode region (anode region 6P+) is formed in a part of a lowest $N^+$ source region 4N+, a $P^+$ base contact region 5P+ adjacent to the lowest $N^+$ source region 4N+, and a part of a next $N^+$ source region 4N+ adjacent to the $P^+$ base contact region 5P+ continuously. That is, the diode region (anode region 6P+) is formed so as to stride a second $P^+$ base contact region 5P+ from the bottom. In addition, other construction of the vertical MOSFET 110 is approximately the same as that of the vertical MOSFET 100 shown in FIGS. 1 to 3.

Thus, even when a diode region (anode region 6P+) is formed so as to stride the $P^+$ base contact region 5P+, it is possible to centralize an avalanche current in the diode region (anode region 6P+) like the vertical MOSFET 100. Thereby, a parasitic bipolar transistor will not be turned on and it becomes possible to prevent breakdown of a device. That is, a formation position of a diode region (anode region 6P+) is not limited, and it becomes possible to obtain a wholly unchanging advantageous effect by arranging the diode region partially.

Third Embodiment

Figure 5:
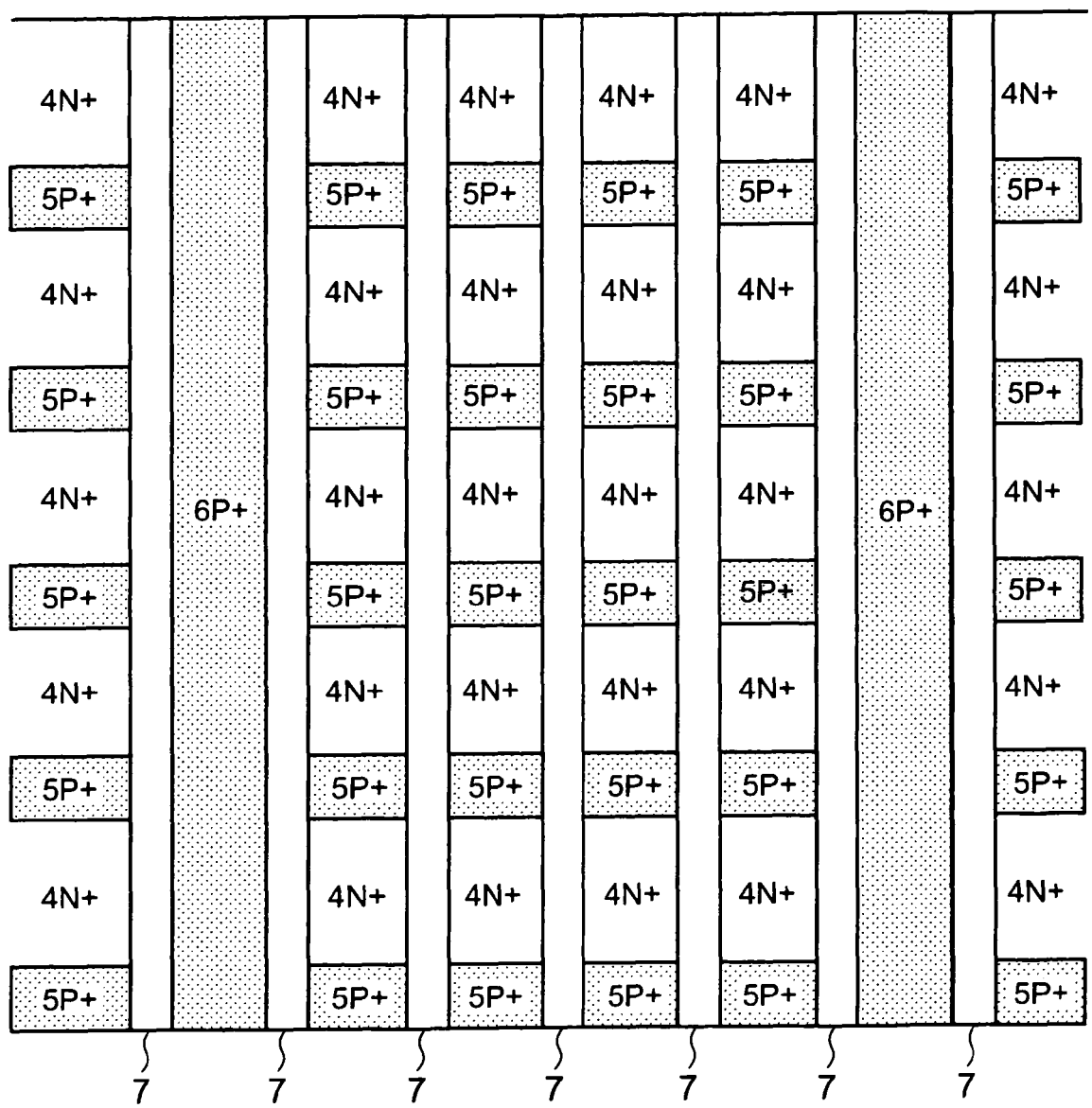
FIG. 5 is a schematic plan view showing planar structure of a vertical MOSFET 120 according to a third embodiment of the present invention.

Construction of a semiconductor device according to a third embodiment of the present invention will be described with reference to FIG. 5. FIG. 5 is a schematic plan view showing planar structure of an N channel type vertical MOSFET 120 which is an example of the semiconductor device according to the third embodiment. In the vertical MOSFET 120, a different point from the vertical MOSFET 100 shown in FIG. 1 is a formation position of a diode region (anode region 6P+). In addition, in FIG. 5, the same reference numerals are assigned to the same components as those in FIGS. 1 to 3, and their descriptions are omitted.

As shown in FIG. 5, in the vertical MOSFET 120, a diode region (anode region 6P+) is formed between arbitrary two adjacent gate trenches 7. In other words, all of the N+ source region 4N+ and the P+ base contact region 5$p$+ of an arbitrary array are replaced with a single anode region 6P+.

Specifically, as shown in FIG. 5, the vertical MOSFET 120 has the gate trenches 7 arranged in stripes like the vertical MOSFET 100. Between the gate trenches 7, N+ source regions 4N+ and P+ base contact regions 5P+ are formed. The N+ source regions 4N+ and P+ base contact regions 5P+ are arranged alternately along a longitudinal direction of the gate trenches 7. Then, one diode region (anode region 6P+) is formed substantially throughout between first and second gate trenches 7 from the left in FIG. 5. As shown in FIG. 5, in the second array from the left, the diode region (anode region 6P+) is continuously formed from one edge at the lower side of the array to the other edge at the upper side of the array. Thus, the diode region has the approximately same size as the size of one array. In addition, other construction of the vertical MOSFET 120 is approximately the same as that of the vertical MOSFET 100 shown in FIGS. 1 to 3.

Thus, even when the diode region (anode region 6P+) is formed continuously between two gate trenches 7, it is possible to centralize an avalanche current in the diode region (anode region 6P+) like the vertical MOSFET 100. Thereby, a parasitic bipolar transistor will not be turned on and it becomes possible to prevent breakdown of a device.

In addition, as shown in FIG. 5, in the vertical MOSFET 120, the diode region (anode region 6P+) has a longitudinal length as that of the array which includes the N+ source region 4N+ and the P+ base contact region 5$p$+. Hence, it is possible to form a diode region (anode region 6P+) by using a mask for forming the source region 4N+ with which a mask pattern is formed so that the source region 4N+ is not to be formed in a region where the diode region (anode region 6P+) is to be formed. And by using a mask for forming the P+ base contact regions 5P+ with which a mask pattern is arranged so that the anode region 6P+ is to be formed simultaneously. For this reason, what is necessary is just to reverse the mask pattern of the region corresponding to the diode region (anode region 6P+) among conventional mask patterns, and hence, it is possible to form mask patterns easily.

Fourth Embodiment

Figure 6:
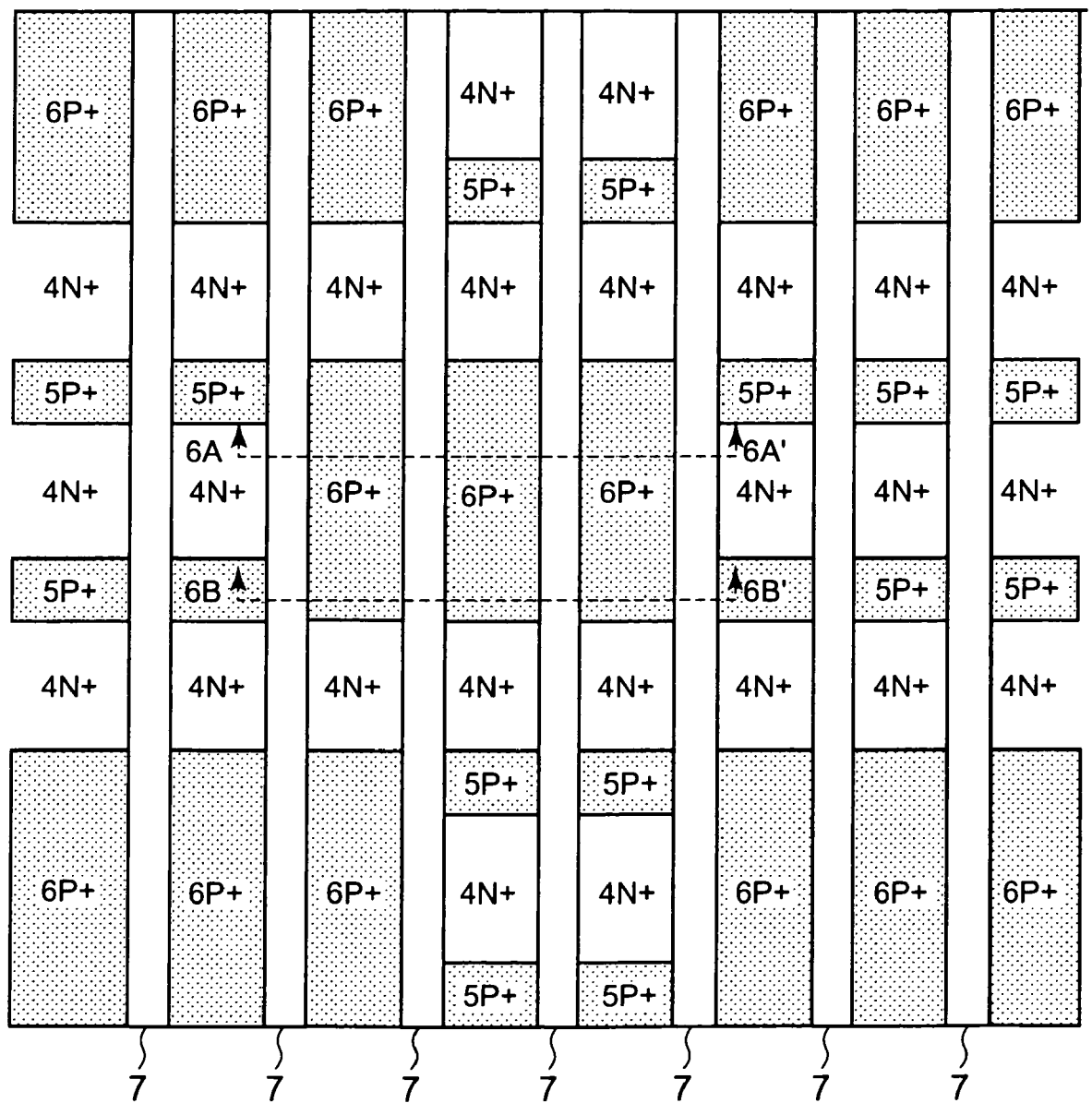
FIG. 6 is a schematic plan view showing planar structure of a vertical MOSFET 130 according to a fourth embodiment of the present invention.
Figure 7:
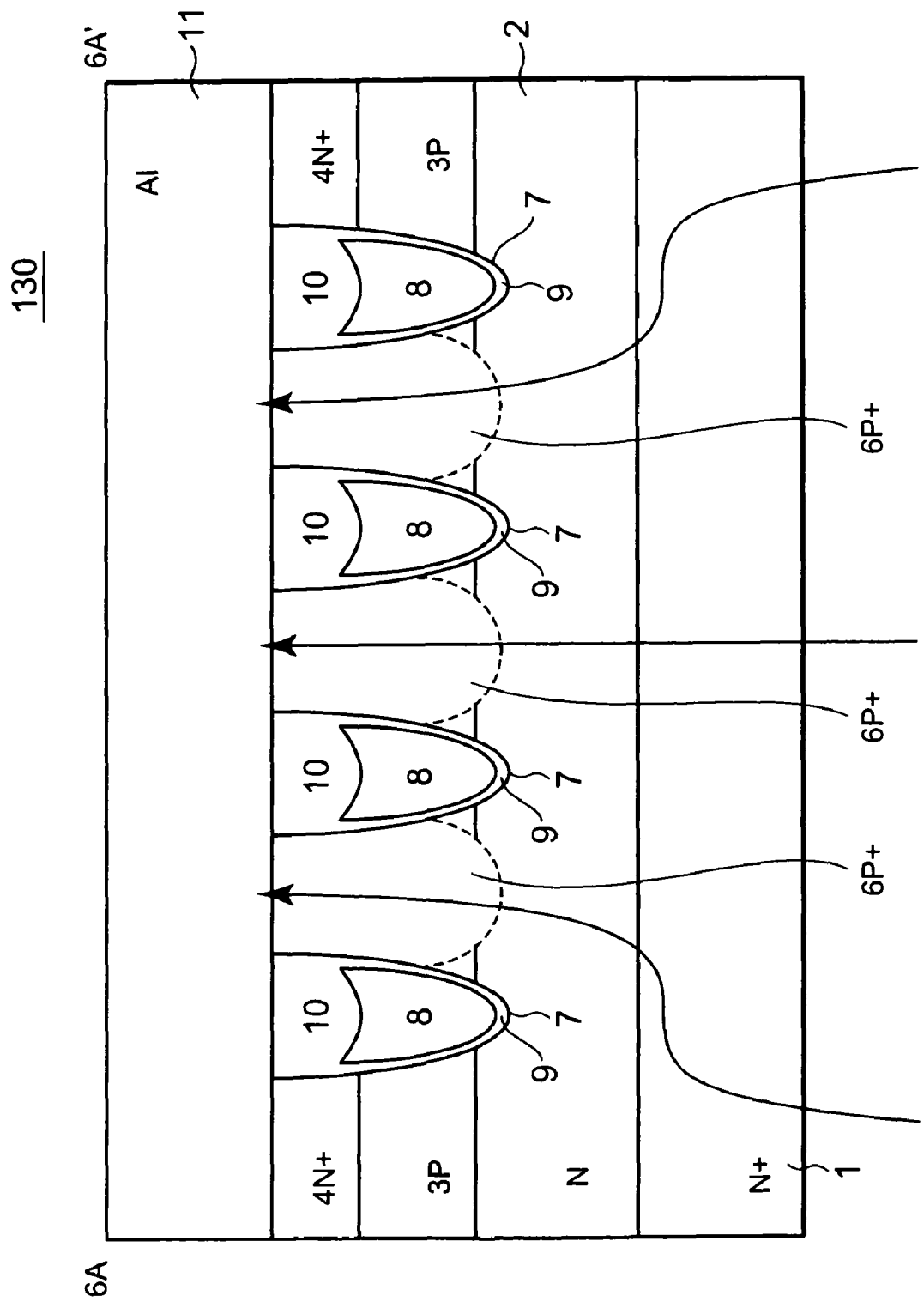
FIG. 7 is a schematic sectional view taken along line 6A-6A' of FIG. 6.
Figure 8:
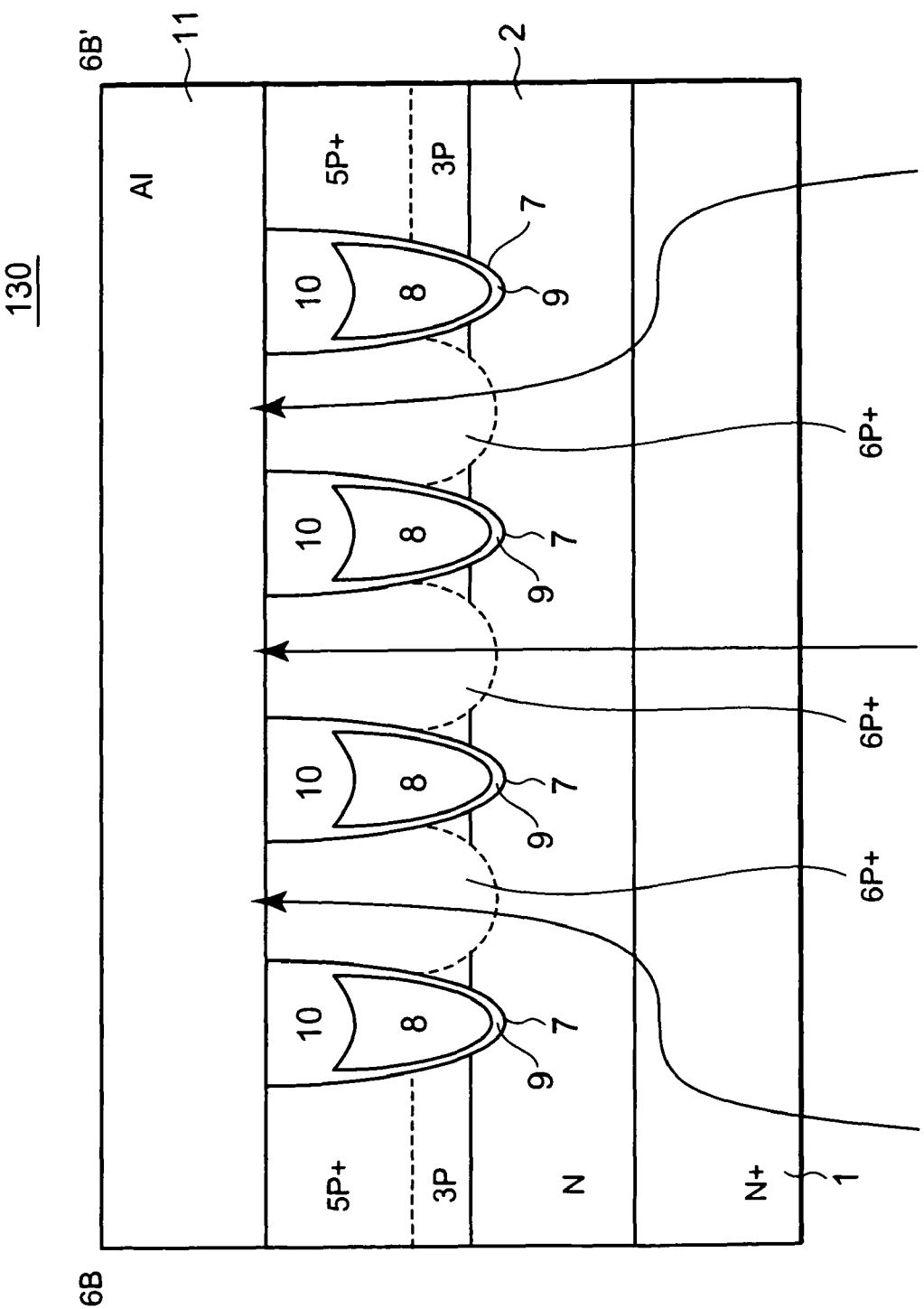
FIG. 8 is a schematic sectional view taken along line 6B-6B' of FIG. 6.
Figure 9:
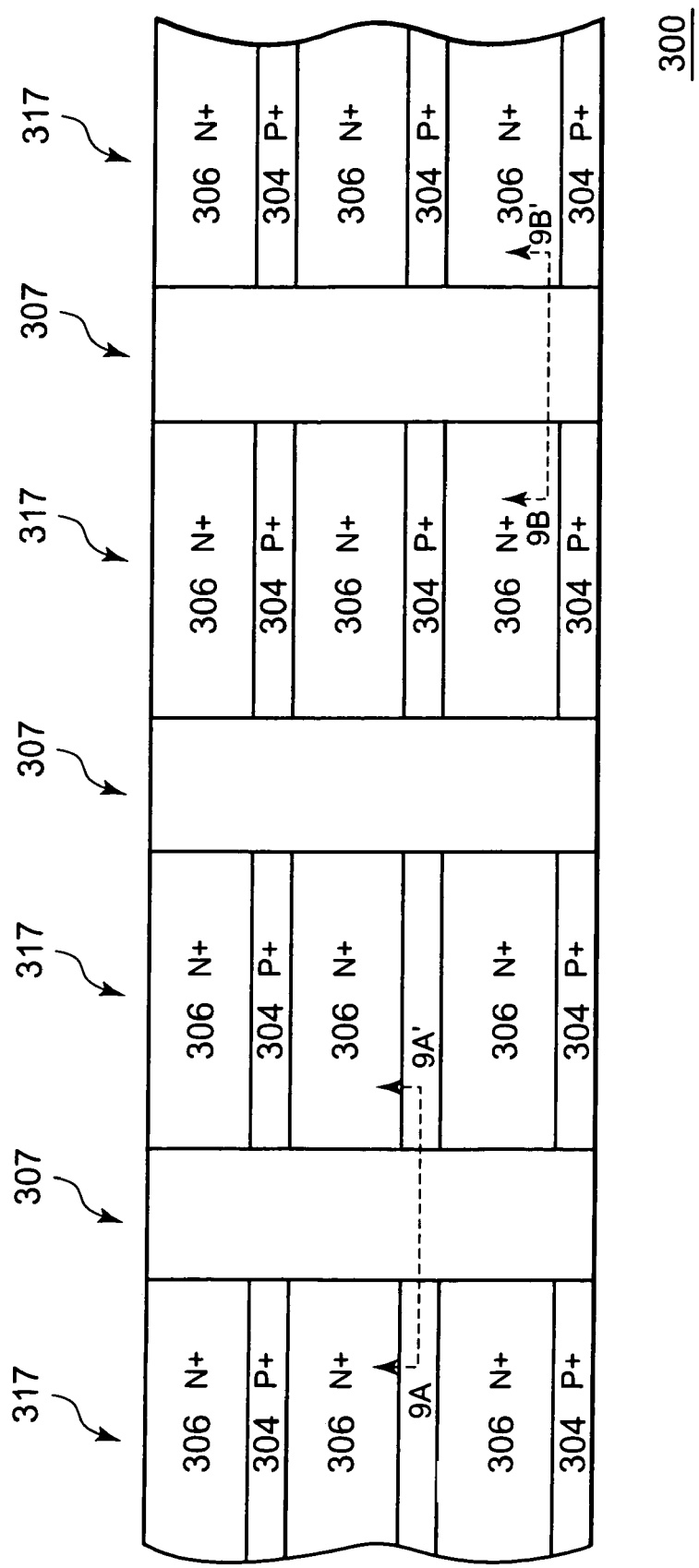
FIG. 9 is a schematic plan view showing planar structure of a conventional vertical MOSFET 300.
Figure 10:
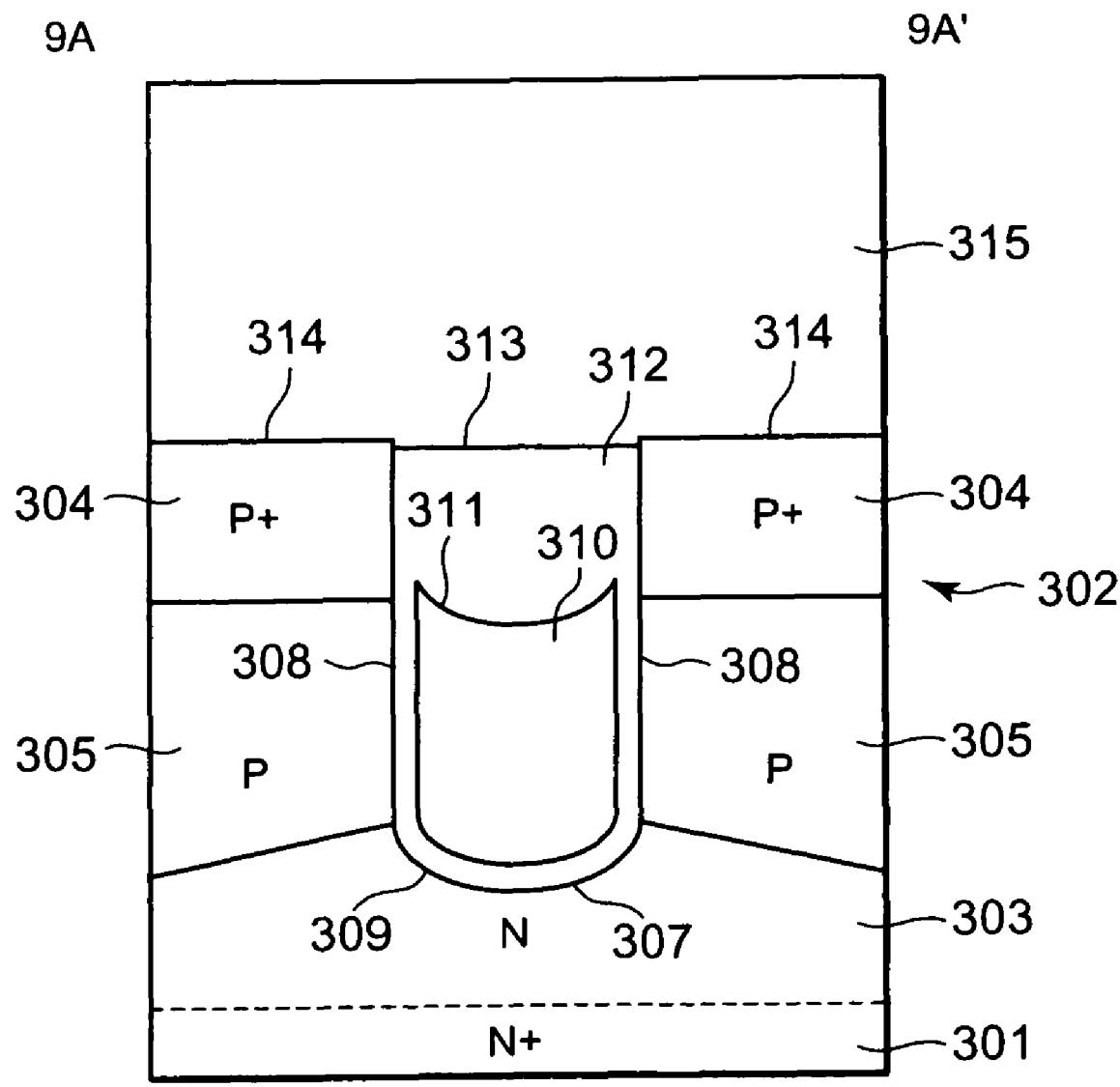
FIG. 10 is a sectional view taken along line 9A-9A' of FIG. 9.
Figure 11:
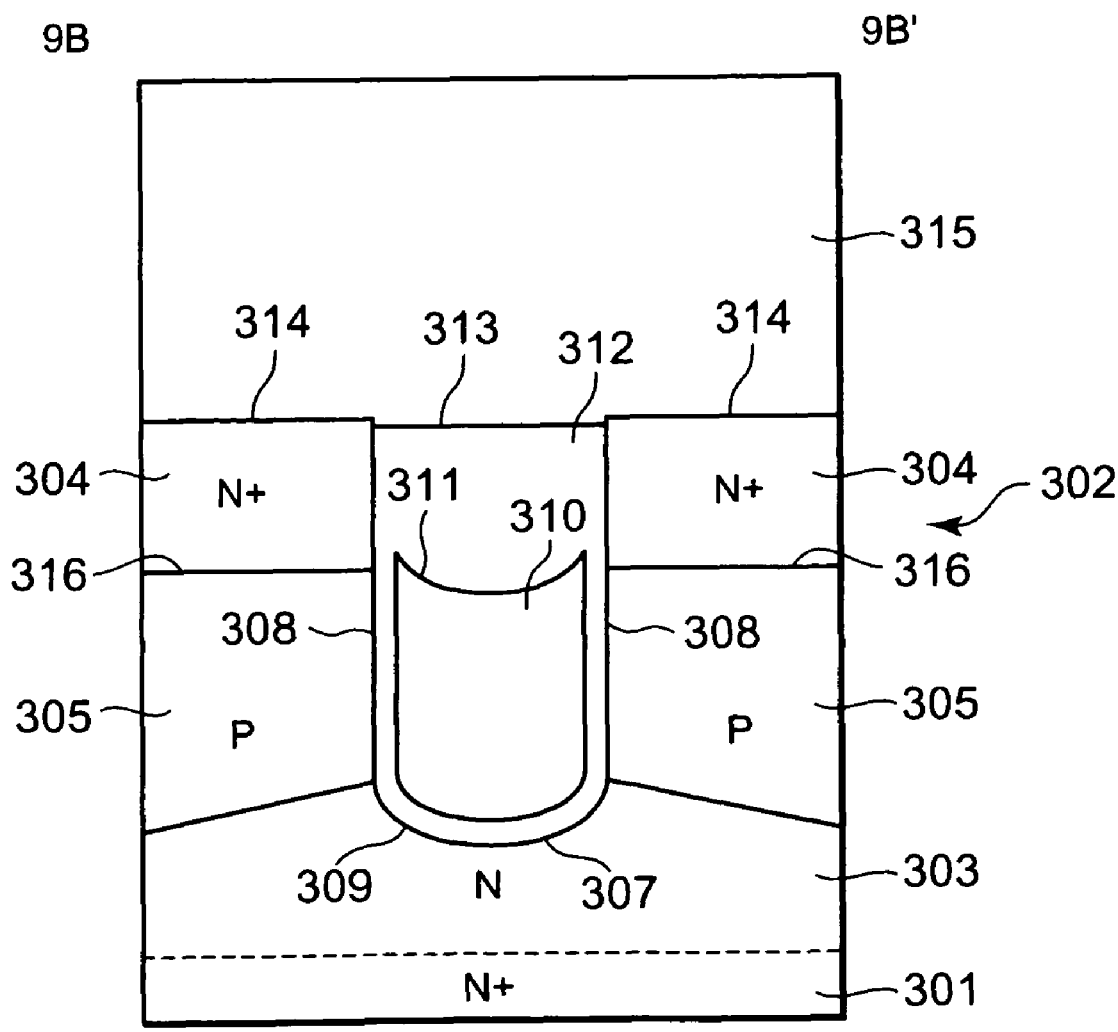
FIG. 11 is a sectional view taken along line 9B-9B' of FIG. 9.
Figure 12:
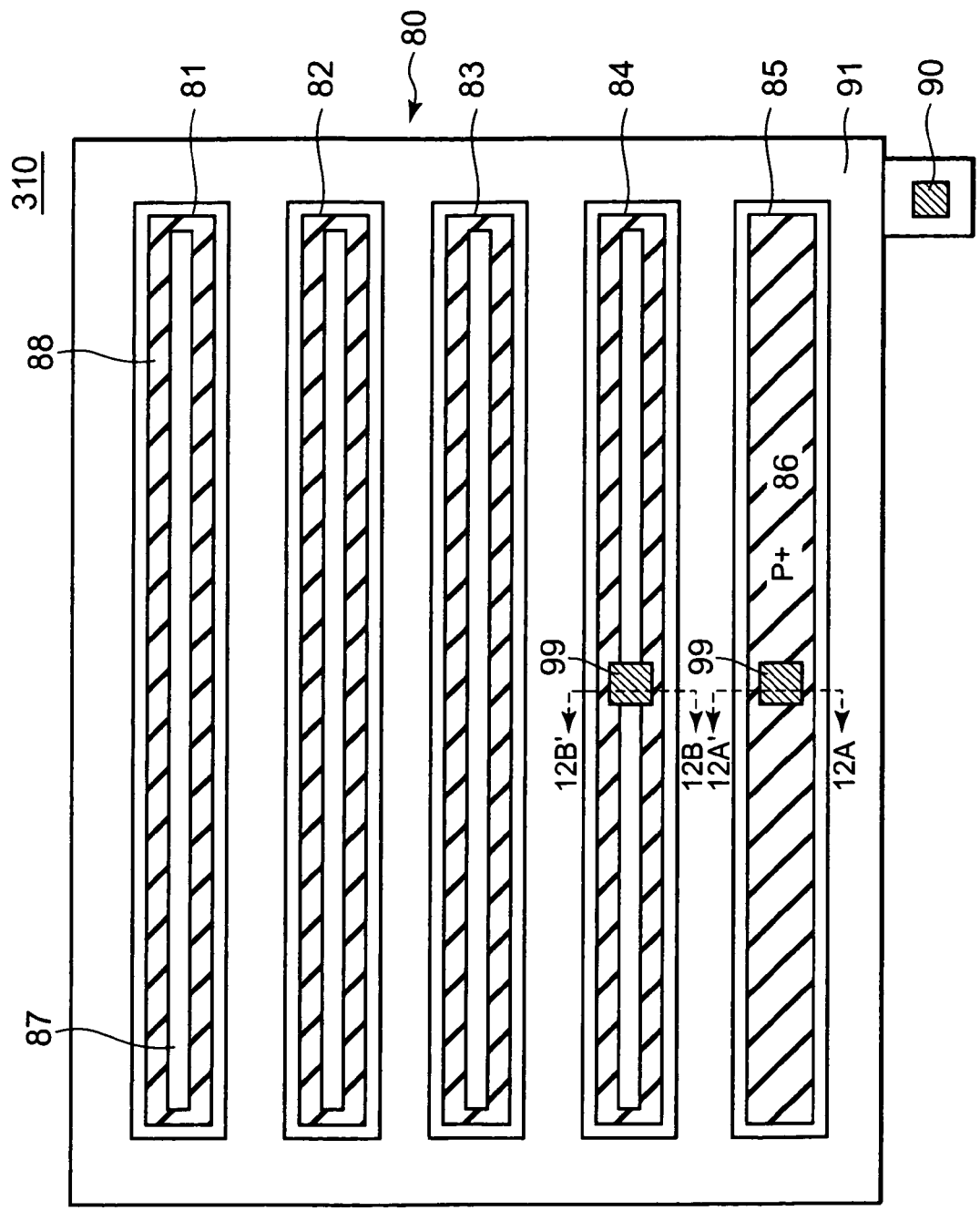
FIG. 12 is a schematic plan view showing planar structure of a conventional vertical MOSFET 310.
Figure 13:
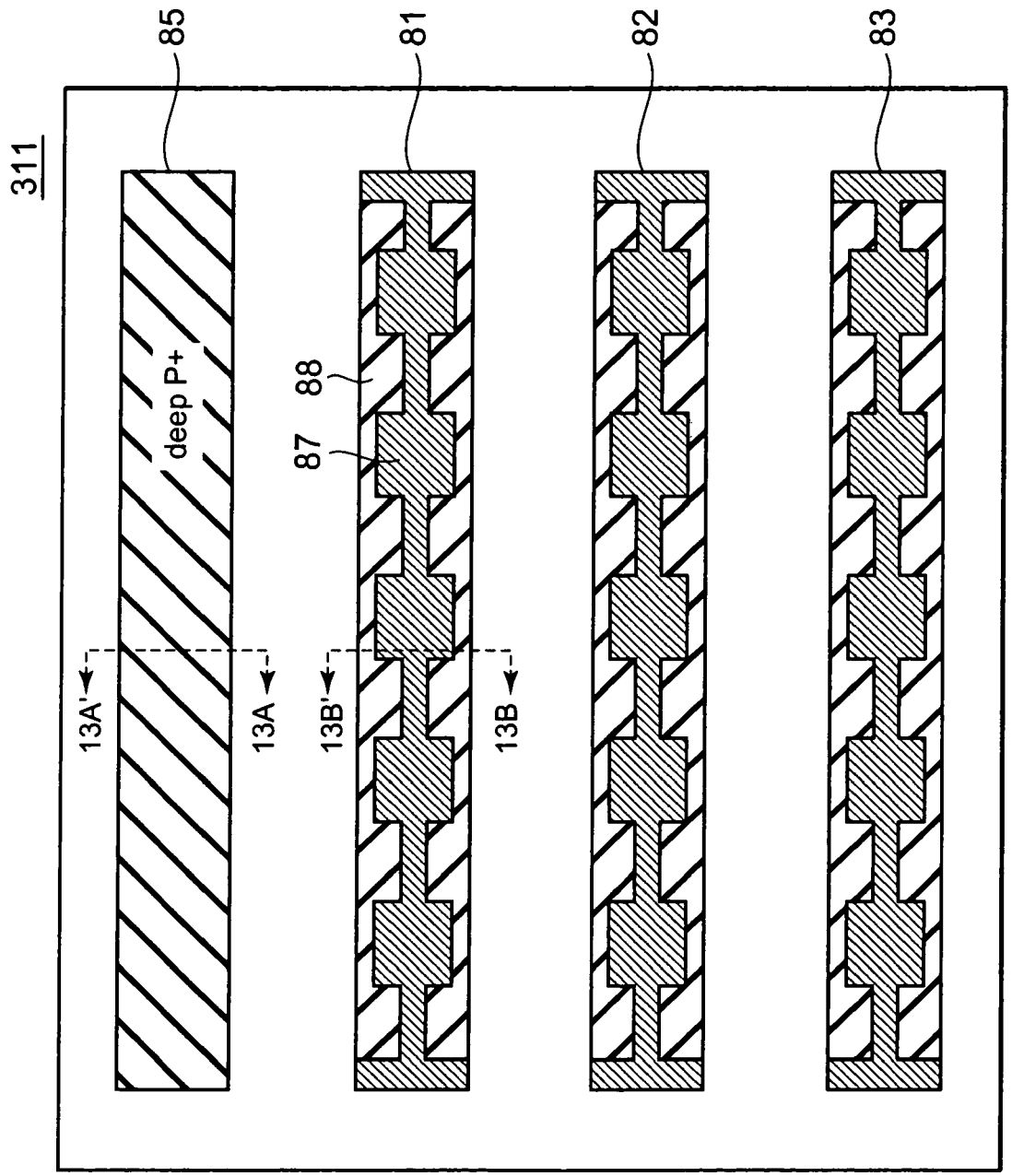
FIG. 13 is a schematic plan view showing planar structure of a conventional vertical MOSFET 311.
Figure 14:
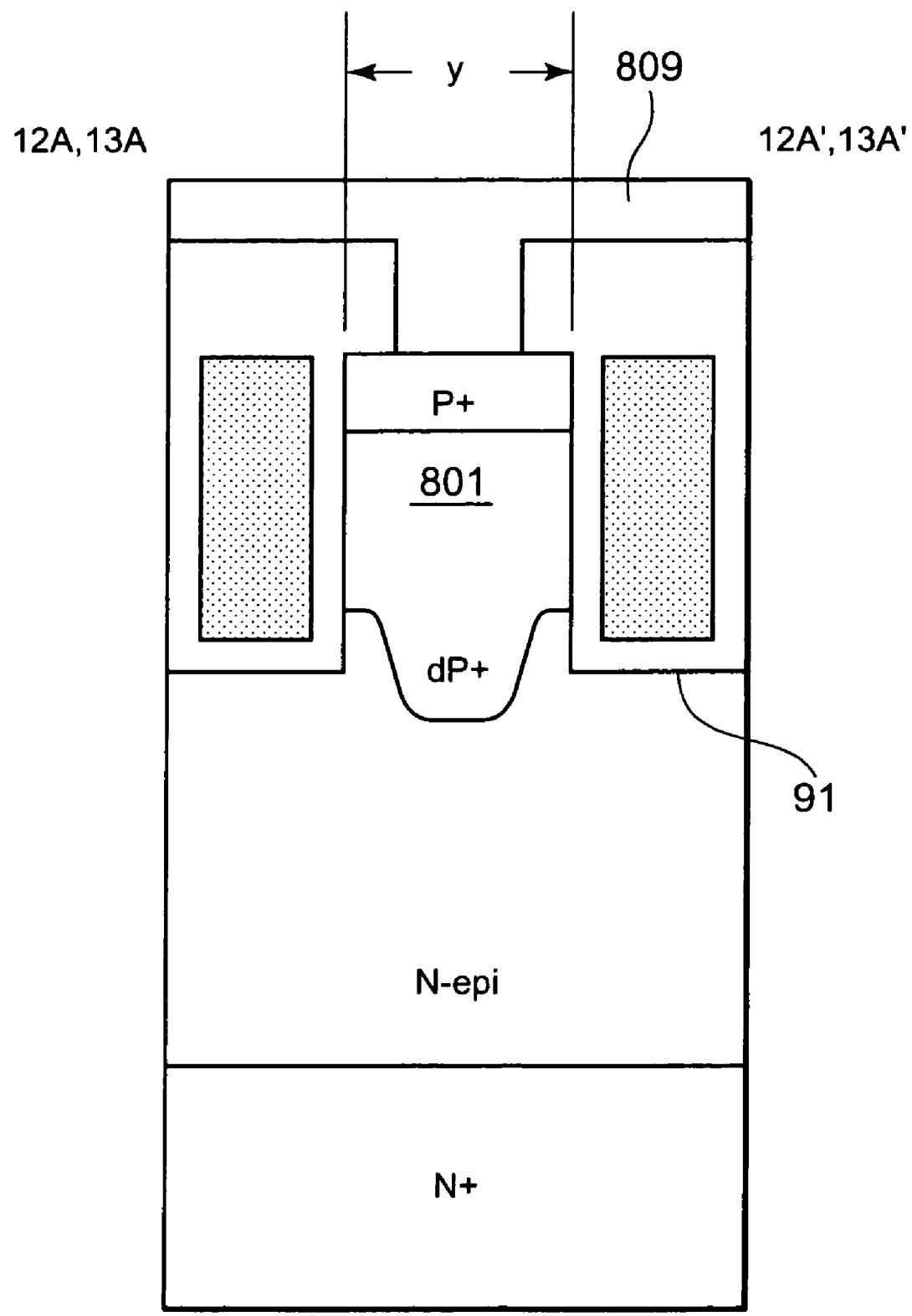
FIG. 14 is a sectional view taken along line 12A-12A' of FIG. 12 or a sectional view taken along line 13A-13A' of FIG. 13.
Figure 15:
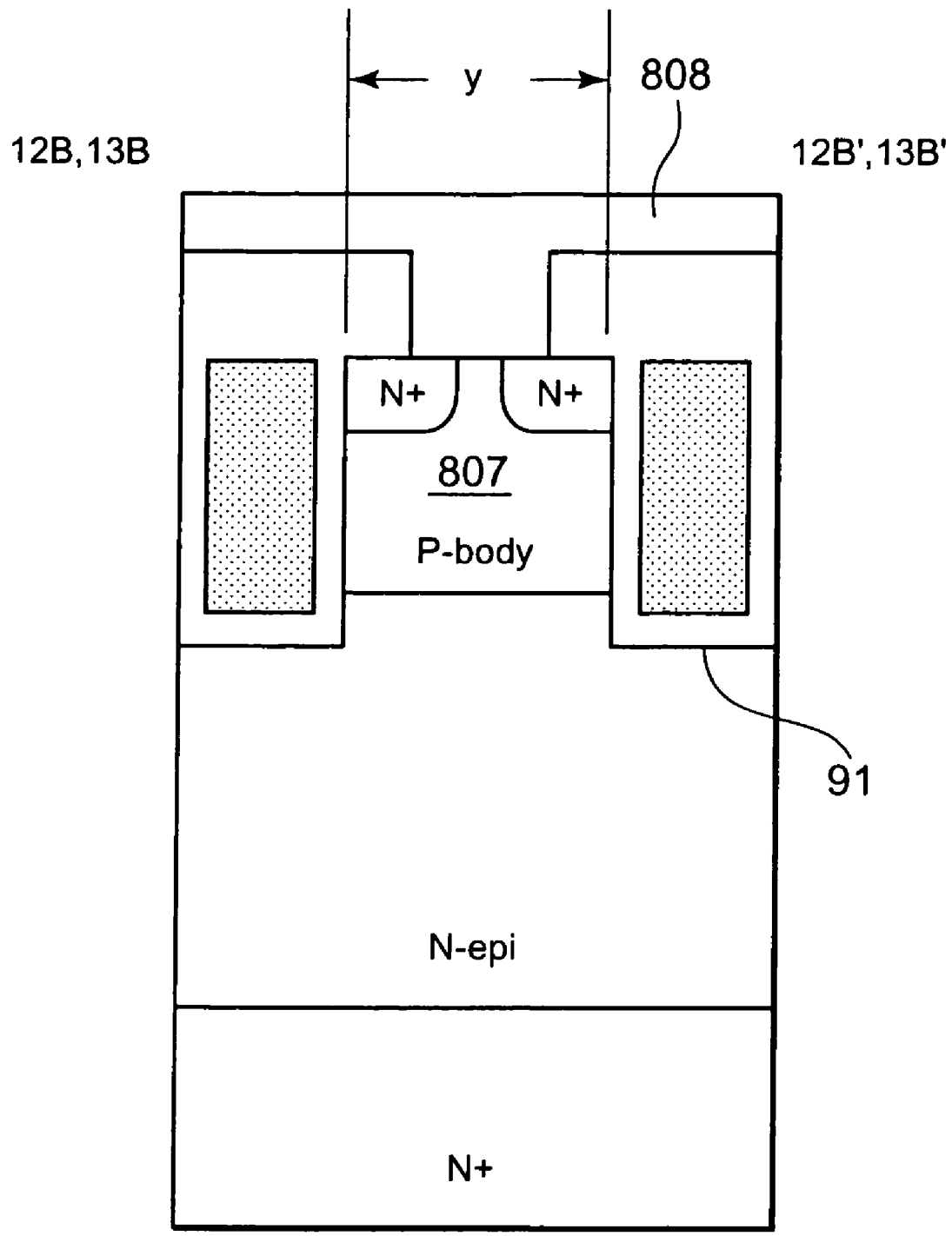
FIG. 15 is a sectional view taken along line 12B-12B' of FIG. 12 or a sectional view taken along line 13B-13B' of FIG. 13.

Construction of a semiconductor device according to a fourth embodiment of the present invention will be described with reference to FIG. 6. FIG. 6 is a schematic plan view showing planar structure of an N channel type vertical MOSFET 130 which is an example of the semiconductor device according to the fourth embodiment. FIG. 7 is a schematic sectional view taken along line 6A-6A' of FIG. 6. FIG. 8 is a schematic sectional view taken along line 6B-6B' of FIG. 6. In the vertical MOSFET 130, a different point from the vertical MOSFET 100 shown in FIG. 1 is a formation position of a diode region (anode region 6P+). In addition, in FIG. 6, the same reference numerals are assigned to the same components as those in FIGS. 1 to 3, and their descriptions are omitted.

In the vertical MOSFET 130, a plurality of diode regions (anode regions 6P+) are formed side by side with the gate trench 7 intervening therebetween. That is, as shown in FIG. 6, in the vertical MOSFET 130, the adjacent two diode regions (anode regions 6P+) are arranged on both sides of the gate trench 7. In an array formed between the gate trenches 7, N+ source regions 4N+ and P+ base contact regions 5P+ are formed. The N+ source regions 4N+ and P+ base contact regions 5P+ are arranged alternately in a direction along the longitudinal direction of the gate trenches 7.

Then, for example, each diode region (anode region 6P+) is formed between second and third, third and fourth, and fourth and fifth gate trenches 7 from the left with striding them in FIG. 6. That is, the diode region (anode region 6P+) is formed with striding third, fourth, and the fifth arrays from the left. In addition, in the vertical MOSFET 130, a diode region (anode region 6P+) has size corresponding to one N+ source region 4N+ and two P+ base contact regions 5P+. For example, as shown in FIG. 6, in a fourth array from the left, a diode region (anode region 6P+) is formed by being corresponding to a region having arbitrary two adjacent P+ base contact region 5P+, which are a third and a fourth ones from the bottom, and one N+ source region 4N+ sandwiched between the two adjacent P+ base contact regions 5P+. In addition, other construction of the vertical MOSFET 130 is approximately the same as that of the vertical MOSFET 100 shown in FIGS. 1 to 3.

In this way, even when a plurality of diode regions (anode regions 6P+) are formed adjacently to each other with the gate trench 7 intervening therebetween, it is possible to centralize an avalanche current in the diode region (anode region 6P+) like the vertical MOSFET 100. Thereby, a parasitic bipolar transistor will not be turned on and it becomes possible to prevent breakdown of a device. In addition, since the plurality of diode regions (anode regions 6P+) are formed adjacently to each other as shown in FIGS. 7 and 8, it is possible to lessen an avalanche current which flows into each diode region (anode region 6P+).

In addition, as shown in FIG. 6, in the vertical MOSFET 130, the diode regions (anode regions 6P+) may be formed in a similar way as described above, it is possible to form the diode regions (anode regions 6P+) by changing mask patterns for forming the source region 4N+ and the P+ base contact regions 5P+ from the conventional mask patterns, and hence, it is possible to form mask patterns easily.

As described above, according to the present invention, it becomes possible to improve the conflicting avalanche resistance without increasing the on resistance Ron. Although N channel type vertical MOSFETs are described in the above descriptions as the examples, a P channel type may be used.

Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A semiconductor device, comprising:
   a plurality of gate trenches arranged in stripes;
   an array sandwiched with the plurality of gate trenches and including source regions and base contact regions which are alternately arranged along a longitudinal direction of the gate trenches; and
   a diode region formed so as to contact with two of the gate trenches which are adjacent to each other,
   wherein a size of the diode region is substantially a same size as one of the source regions and two of the base contact regions.

2. The semiconductor device according to claim 1, wherein the diode region is formed in the array with the source regions and the base contact regions.

3. The semiconductor device according to claim 2, wherein the diode region is formed between two of the source regions.

4. The semiconductor device according to claim 2, wherein the array comprises a plurality of ones of the diode region.

5. The semiconductor device according to claim 1, further comprising another diode region, wherein the diode region and the another diode region are juxtaposed so as to sandwich at least one of the gate trenches therebetween.

6. The semiconductor device according to claim 1, further comprising:
   a gate electrode formed in one of the gate trenches; and
   an interlayer insulating film formed on the gate electrode, wherein the interlayer insulating film is formed in the one of the gate trenches.

7. The semiconductor device according to claim 1, wherein the diode region is juxtaposed to adjacent two of the base contact regions and a source region sandwiched therebetween in an adjacent array.

8. The semiconductor device according to claim 1, wherein the diode region is juxtaposed to adjacent two of the source regions and the base contact region sandwiched therebetween in an adjacent array.

9. The semiconductor device according to claim 2, wherein the diode region is formed between said two of the base contact regions in the array.

10. The semiconductor device according to claim 1, wherein the array is defined as a first array, the semiconductor device further comprising:
    a second array comprising a plurality of diode regions and a plurality of base contact regions, each of the plurality of diode regions having a size substantially the same as said one of the source regions and said two of the base contact regions in the first array, each of the plurality of base contact regions having a same size as the base contact regions in the first array, each of the plurality of diode regions and each of the plurality of base contact regions being alternately arranged along the longitudinal direction of the gate trenches in the second array.

* * * * *